US006973614B1

(12) United States Patent
Hagenauer et al.

(10) Patent No.: US 6,973,614 B1
(45) Date of Patent: Dec. 6, 2005

(54) METHOD BASE STATION AND SUBSCRIBER STATION FOR CHANNEL CODING IN A GSM MOBILE RADIO SYSTEM

(75) Inventors: Joachim Hagenauer, Seefeld (DE); Thomas Hindelang, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/856,399

(22) PCT Filed: Nov. 19, 1999

(86) PCT No.: PCT/DE99/03698

§ 371 (c)(1),
(2), (4) Date: Sep. 5, 2001

(87) PCT Pub. No.: WO00/31880

PCT Pub. Date: Jun. 2, 2000

(30) Foreign Application Priority Data

Nov. 19, 1998 (DE) ................................ 198 53 443

(51) Int. Cl.[7] .......................................... H03M 13/03
(52) U.S. Cl. ...................... 714/786; 714/755; 714/758; 704/219

(58) Field of Search ................................ 714/786, 787, 714/788, 790, 792–796, 758, 755, 761–762, 714/702; 375/262, 341; 455/422; 704/219; 370/209, 252

(56) References Cited

U.S. PATENT DOCUMENTS 6,018,304 A * 1/2000 Bessios ........................ 341/58
6,137,773 A * 10/2000 Stilwell et al. .............. 370/209
6,397,367 B1 * 5/2002 Park et al. ................... 714/786

OTHER PUBLICATIONS

Burkert et al. "Turbo" decoding with unequal error protection applied to GSM speech coding, IEEE, 1996.*

* cited by examiner

Primary Examiner—Guy J. Lamarre
(74) Attorney, Agent, or Firm—Bell Boyd & Lloyd LLC

(57) ABSTRACT

A method, base station and subscriber station which use recursive systematic codes (RSC codes) for channel coding in GSM mobile radio systems. In addition, these RSC codes also can be used on the basis of the hardware installed in existing GSM mobile radio systems. The RSC codes can be introduced during the introduction of an adaptive multirate coder.

9 Claims, 5 Drawing Sheets

FIG. 5

$G0 = 1 + D^3 + D^4$ $G1 = 1 + D + D^3 + D^4$ $G2 = 1 + D^2 + D^4$ $G3 = 1 + D + D^2 + D^3 + D^4$ $G4 = 1 + D^2 + D^3 + D^5 + D^6$      TCH / AMR-FS, TCH / AMR-HS $G5 = 1 + D + D^4 + D^6$      TCH / AMR-FS, TCH / AMR-HS $G6 = 1 + D + D^2 + D^3 + D^4 + D^6$ $G7 = 1 + D + D^2 + D^3 + D^5$      TCH / AMR-FS, TCH / AMR-HS $G8 = 1 + D^2 + D^4 + D^5$      TCH / AMR-FS, TCH / AMR-HS $G9 = 1 + D^3 + D^4 + D^5$      TCH / AMR-FS $G10 = 1 + D + D^2 + D^3 + D^6$      TCH / AMR-FS, TCH / AMR-HS $G11 = 1 + D^2 + D^3 + D^4 + D^5 + D^6$      TCH / AMR-FS $G12 = 1$      TCH / AMR-FS, TCH / AMR-HS $G13 = G8 / G7$      TCH / AMR-FS, TCH / AMR-HS $G14 = G9 / G7$      TCH / AMR-FS $G15 = G10 / G4$      TCH / AMR-FS, TCH / AMR-HS $G16 = G5 / G4$      TCH / AMR-FS, TCH / AMR-HS $G17 = G11 / G4$      TCH / AMR-FS

TCH / AMR-FS    User data channel, adaptive multi-rate encoding, full rate

TCH / AMR-HS    User data channel, adaptive multi-rate encoding, half rate

METHOD BASE STATION AND SUBSCRIBER STATION FOR CHANNEL CODING IN A GSM MOBILE RADIO SYSTEM

BACKGROUND OF THE INVENTION

1. Field of the Invention

The present invention relates, generally, to a method, base station and subscriber station for channel coding in a GSM mobile radio system and, more specifically, to such a method, base station and subscriber station which uses recursive systematic codes (RSC codes) for the associated channel coding.

2. Description of the Prior Art

The GSM (global system for mobile communications) mobile radio system is installed in more than 100 networks and for more than 100 million subscribers worldwide. In the GSM mobile radio system, data (for example, voice or data within data services such as SMS or GPRS) are transmitted via a radio interface with the aid of electromagnetic waves. The radio interface relates to a connection between a base station and subscriber stations where the subscriber stations can be mobile stations or stationary radio stations. The electromagnetic waves are radiated in this case with carrier frequencies which are within the frequency bands of 900, 1800, and 1900 MHz in the GSM mobile radio system.

In mobile radio systems, channel coding is required for transmitting the data via the radio interface. This channel coding differs for different services, e.g. 14.4 kbps data, FR (full-rate) voice, HR (half-rate) voice. The channel coding and the complementary channel decoding at the receiving end have the aim here of achieving the lowest possible bit error rate (BER).

Hitherto, only nonsystematic nonrecursive convolutional codes (NSC—nonsystematic convolutional codes) have been used for channel coding in the GSM mobile radio system (and other comparable systems). In these codes, a coded bit is generated from a weighted sum of the current and past information bits by convolutional coding. At a coding rate of ½, e.g. 2 coded bits, which in each case come from a differently weighted sum, are thus generated from one information bit (see FIG. 2). The weights in this sum, and thus the generation of the coded bits, are determined by the so-called generator polynomials. Thus, e.g., the polynomial $1+D^3+D^4$ determines that a coded bit is produced from the sum (XOR combination) of the current, the third last and the fourth last information bit.

The bits coded during the channel coding are transmitted via the radio interface and channel-decoded at the receiving end. A frequently used decoding algorithm is the so-called Viterbi algorithm. Since the decoding process remains the same and is also computationally intensive, hardware chips (application-specific integrated circuits (ASICs)) are used for this purpose, especially in base stations. As a rule, these ASICs can only process a certain decoding scheme, only for nonrecursive currents in the case of GSM.

In the case of the introduction of a new voice coding message for GSM mobile radio systems, the methods hitherto proposed for the channel coding, see ETSI SMG11; Tdoc SMG11 205/98, 159/98 and 147/98, 9.28.98, are exclusively based on nonrecursive codes in order to ensure compatibility with the existing hardware which is used in millions. In spite of the involvement of many manufacturers in the development process, see Tdoc SMG11 205/98, 159/98 and 147/98, of 9.28.98, other types of code have been considered to be unusable.

The present invention, therefore, directed to a method for channel coding and corresponding devices which produce better transmission quality.

SUMMARY OF THE INVENTION

Accordingly, the present invention uses recursive systematic codes (RSC codes) for the channel coding, with voice information which is to be coded firstly being arranged on the basis of its sensitivity to transmission errors and/or on the basis of a priority which is associated with it, and being subdivided into at least first and second voice information. For first voice information, a channel coding is performed which, in a first coding step, uses error protection codes for a cyclic redundancy check and, in a second coding step, uses recursive systematic codes having a numerator polynomial and a denominator polynomial. By contrast, for second voice information, a channel coding is performed which uses recursive systematic codes having a numerator polynomial. These differ from the NSC codes in that, e.g. at a rate of ½, the first "coded" bit corresponds to the current information bit (systematic) and the second coded bit is produced from the current and past information bits and past coded bits (recursive). Thus, codes which are fed back are used, making use of the fact that recursive systematic codes have distinctly better code characteristics, and thus also better characteristics with respect to the error correction, especially at high bit error rates.

The RSC codes, known from, among others, E. Offer, "Decodierung mit Qualitätsinformation bei verketteten Codiersystemen" [Decoding with quality information in concordinated coding systems], progress reports, VDI-Verlag, Series 10, Vol. 443, Düsseldorf 1996, p. 21 ff and p. 119 ff, have previously not been used since they result in changes in the decoding process and are thus not hardware-compatible. An introduction of RSC codes in the channel coding did not appear possible since the installed base stations had to be retrofitted. This is not the case, in fact, since the hardware structure can be retained both at the transmitting end and at the receiving end and, nevertheless, RSC codes can be introduced for channel decoding in the GSM mobile radio system.

It is proposed to perform post-processing on the basis of the denominator polynomial with parts of the recursive systematic code after channel decoding at the receiving end. According to an advantageous further embodiment of the present invention, the decoding process is performed as previously with decoding of a NSC code, namely the one which is identical to the nonrecursive component, the numerator polynomial, of the new RSC code. After this hardware-compatible decoding, post-processing follows in which the bits obtained this way are again coded with the denominator polynomial. This post-processing is advantageously performed via programming, that is to say in software, which can be more easily loaded into existing stations later.

The coding of the post-processing is not computationally expensive and can be performed as an additional step in every base station. This recoding provides the exact bits of the data sequence of the transmitting end.

A recursive decoding which is not possible with previously installed hardware can be replaced by decoding into two nonrecursive successive individual steps. The first step is decoding using the numerator polynomial of the recursive code and the second step is a coding using the denominator polynomial of the recursive code. This makes it possible to reproduce, if necessary, any systematic recursive codes using hardware which has already been installed. The first step corresponds to the previous decoding and the second step is the post-processing.

The polynomials of identical RSC and NSC codes will be explained briefly in connection with FIGS. 2 and 3. In a typical NSC code (such as, e.g. GSM/TCHFS).

The generator polynomials there are:
Polynomials of the NSC codes:
$G_1 = 1 + D^3 + D^4$
$G_2 = 1 + D + D^3 + D^4$
An identical RSC code is generated by dividing; e.g., by $G_1$:
$G_1 = 1$
Polynomials of the RSC code:

$$G_2 = \frac{1 + D + D^3 + D^4}{1 + D^3 + D^4} \cdots$$

These RSC codes have the advantage that lower bit error rates are possible in the case of core channels (up to a bit error rate of $10^{-4}$) since the channel error rate is not exceeded due to the uncoded bits (systematic component). In contrast, the bit error rate of coded bits also can be greater than the channel error rate under very poor channel conditions.

According to an advantageous embodiment of the present invention, a priori knowledge is obtained from a previous detection at the receiving end and this a priori knowledge is used in a subsequent channel decoding. During the transmission of coded voice, a number of voice parameters, and thus bits, change only rarely. It is also possible to make predictions of the probable current value from the value these parameters had in the past. If then the received current value distinctly deviates from the predicted value, there is a high probability of a transmission error and, for example, the received value can be replaced by the predicted value.

This previous knowledge (a priori knowledge) is introduced in the channel decoder and has previously been impossible in most cases since the decoding algorithm had to be modified due to the use of non-systematic codes. As a rule, the modification was, in turn, not hardware-compatible. If RSC codes are used, this a priori knowledge can be introduced quite simply before the decoding process since some of the received bits are uncoded. The decoding process itself does not need to be modified.

As already explained, some of the received bits are uncoded information bits. If the channel conditions are good, i.e. no transmission errors are to be expected, channel decoding can be omitted and only the information bits are used. The transmission quality can then be determined as early as before the channel decoder by advantageously evaluating information from a channel estimator. After that, a decision is made as to whether decoding is necessary or not. In subscriber stations in which the energy consumption is an essential quality criterion, an essential advantage is that the channel decoder can be switched off. This saves power. In addition, the hardware for channel decoding can be omitted altogether in applications, e.g. SMS applications for linking in telemetry services etc., in which a high transmission quality is always expected.

Due to a nonrecursive decoding followed by coding, it becomes possible to use RSC codes with the advantages described above in existing GSM mobile radio systems on existing hardware.

An exemplary embodiment of the present invention is explained in greater detail on the basis of the network structure of the known GSM mobile radio system according to FIG. 1 and referring to the codes according to FIGS. 2 and 3.

Additional features and advantages of the present invention are described in, and will be apparent from, the Detailed Description of the Preferred Embodiments and the Drawings.

DESCRIPTION OF THE DRAWINGS

FIG. 5 shows polynomials used in the coding and decoding; and

DETAILED DESCRIPTION OF THE PREFERRED EMBODIMENTS

Figure 1:
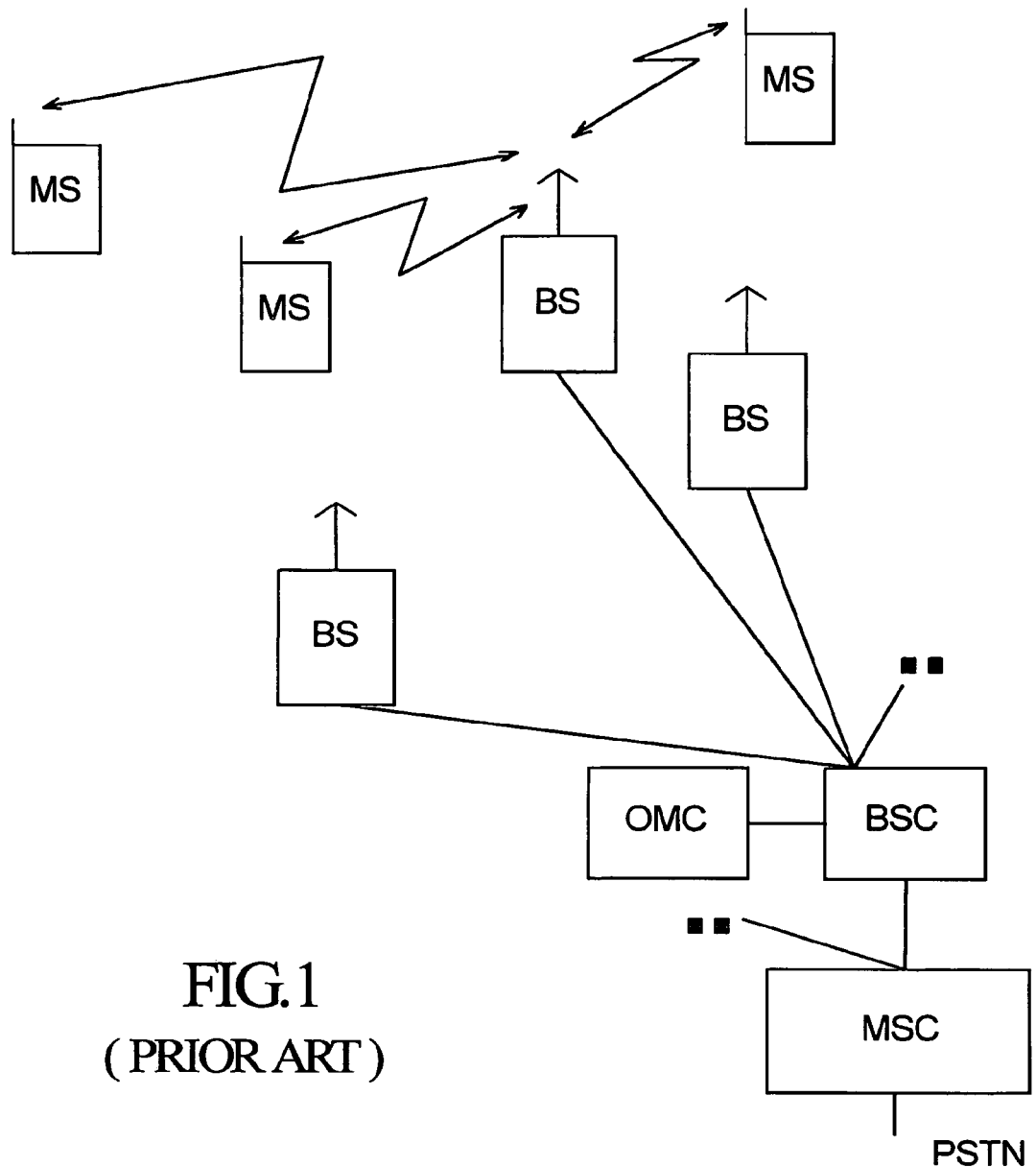
FIG. 1 shows the network structure of a known GSM mobile radio system.
Figure 2:
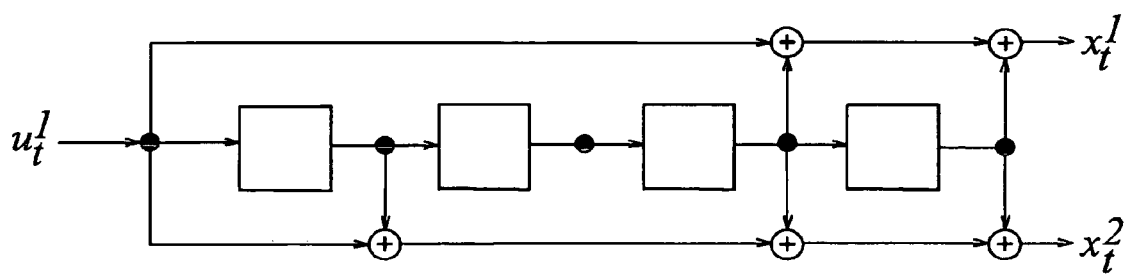
FIGS. 2 and 3 show RSC and NSC codes used in connection with the system of FIG. 1.
Figure 3:
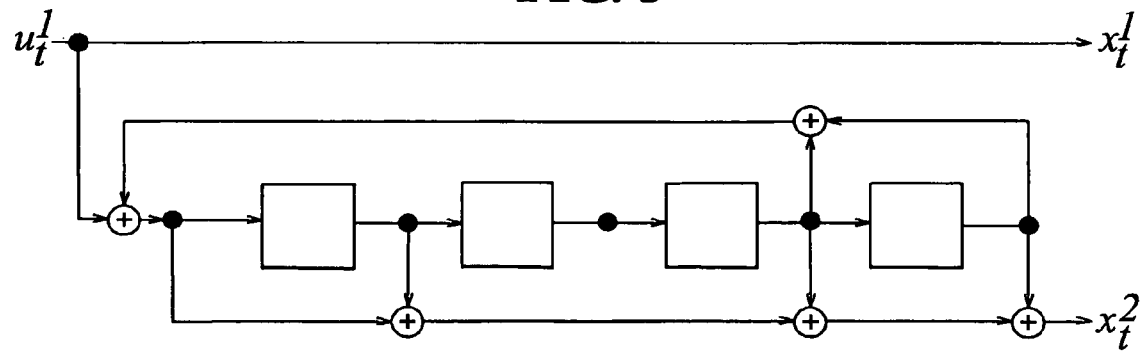

The GSM mobile radio system shown in FIG. 1 consists of a multiplicity of mobile switching centers MSC which are networked together and, respectively, establish access to a landline network PSTN. These mobile switching centers MSC are also connected to, in each case, at least one base station controller BSC for controlling base stations BS. Each of these base station controllers BSC, in turn, provides for a connection to at least one base station BS. An operation and maintenance center OMC implements control and maintenance functions for the mobile radio system or for parts thereof, respectively.

A base station BS can set up a connection to subscriber stations, e.g. mobile stations MS or other mobile and stationary terminals, via a radio interface. Each base station BS forms at least one radio cell. FIG. 1 shows connections for transmitting user information between a base station BS and mobile stations MS.

In the coding methods shown, voice information is transmitted as user information. The bits of the voice information are divided into three classes with respect to the weighting (Class 1a, 1b and 2) in accordance with their sensitivity to errors. The most important bits (Class 1a) are additionally protected by a cyclic redundancy check (CRC) error protection coding. The bits of Classes 1a and 1b are convolutionally coded and punctured. In the AMR, the interleaving of the data after the coding is performed in accordance with the interleaving arrangements previously introduced for FR and HR.

Altogether, 14 coding methods are presented in conjunction with the AMR coder, from which a selection must be made in accordance with the transmission conditions. Of these, eight coding modes can be used in full-rate mode and six coding modes can be used in half-rate mode.

| Transmission mode | Channel coding mode | Source encoding bit rate, voice | Net bit rate, in-band signaling | Channel coding bit rate, voice | Channel coding bit rate, in-band |
|---|---|---|---|---|---|
| TCH/FR | CH0-FS | 12.20 kbit/s (GSM EFR) | 0.10 bit/s | 10.20 kbit/s | 0.30 kbit/s |
|  | CH1-FS | 10.20 kbit/s | 0.10 bit/s | 12.20 kbit/s | 0.30 kbit/s |
|  | CH2-FS | 7.95 kbit/s | 0.10 bit/s | 14.45 kbit/s | 0.30 kbit/s |
|  | CH3-FS | 7.40 kbit/s (IS-641) | 0.10 bit/s | 15.00 kbit/s | 0.30 kbit/s |
|  | CH4-FS | 6.70 kbit/s | 0.10 bit/s | 15.70 kbit/s | 0.30 kbit/s |
|  | CH5-FS | 5.90 kbit/s | 0.10 bit/s | 16.50 kbit/s | 0.30 kbit/s |
|  | CH6-FS | 5.15 kbit/s | 0.10 bit/s | 17.25 kbit/s | 0.30 kbit/s |
|  | CH7-FS | 4.75 kbit/s | 0.10 bit/s | 17.65 kbit/s | 0.30 kbit/s |

-continued

| Transmission mode | Channel coding mode | Source encoding bit rate, voice | Net bit rate, in-band signaling | Channel coding bit rate, voice | Channel coding bit rate, in-band |
|---|---|---|---|---|---|
| TCH/HR | CH8-HS | 7.95 kbit/s | 0.10 bit/s | 3.25 kbit/s | 0.10 kbit/s |
| | CH9-HS (IS-41) | 7.40 kbit/s | 0.10 bit/s | 3.80 kbit/s | 0.10 kbit/s |
| | CH10-HS | 6.70 kbit/s | 0.10 bit/s | 4.50 kbit/s | 0.10 kbit/s |
| | CH11-HS | 5.90 kbit/s | 0.10 bit/s | 5.30 kbit/s | 0.10 kbit/s |
| | CH12-HS | 5.15 kbit/s | 0.10 bit/s | 6.05 kbit/s | 0.10 kbit/s |
| | CH13-HS | 4.75 kbit/s | 0.10 bit/s | 6.45 kbit/s | 0.10 kbit/s |

An in-band signaling with 2 bits net (4 or, respectively, 8 bits gross after coding) per frame (20 ms) is used for signaling the coding mode or for signaling the transmission quality in alternating frames. The two bits can be used for signaling four coding modes. These coding modes, which can be switched between via the in-band signaling, must be previously selected.

The following order of steps to be performed applies to all modes:

1. Information of the in-band signaling is coded with a block code;
2. The user information is sorted in accordance with their significance (class);
3. The ordered bits of the user information are coded with a systematic block code (CRC), generating words with voice and parity bits;
4. These coded bits and the rest of the Class 1 bits are convolutionally coded;
5. The coded bits are punctured in order to obtain the desired bit rate,
6. Unprotected bits are inserted into the frame with punctured data (only for half-rate mode); and
7. The bits are reordered and the coded and in-band bits are interleaved, also inserting a so-called stealing flag.

The designations used have the following significance:

k, j Numbering of the bits in data block or burst
$K_x$ Number of bits in a block, x specifies data type
n Numbering of the output data blocks
N A selected data block
B Numbering of bursts or blocks
s(k) Voice information before sorting, k=1 ... $K_s$ (interface 0 in FIG. 4)
d(k) Voice information before channel coding, k= .... $K_d$−1(interface 1 in FIG. 4)
id(k) Bits of the in-band signaling, k=0,1
ic(k) Coded bits of the in-band signaling,
  k=0 ... 3 (HR), 7 (FR)
u(k) Data after the first coding step,
  k=0,1, ... $K_u$−1
  (block coding, CRC coding)
  (interface 2 in FIG. 4)
c(n,k), c(k) Data after the second coding step,
  k=0,1 ... $K_c$−1, n=0,1 ... N,N+1
  (convolutional coding), (interface 3 in FIG. 4)
i(B,k) Interleaved data, k=0,1 ... $K_j$−1, B=$B_0$, $B_0$+1, ...
e(B,k) Bits of a burst, k=0,1,114,115; B=$B_0$, $B_0$+1, ...
  (interface 4 in FIG. 4)

Coding in Full-Rate Mode (FR)

Coding of the Bits of the In-Band Signaling:

| id(0,1) | ic(0 ... 7) |
|---|---|
| 00 | 00000000 |
| 01 | 10111010 |
| 10 | 01011101 |
| 11 | 11100111 |

Distribution of the Bits to Classes:

| Coding mode | Number of voice bits per block | Number of Class-1 bits per block | Number of Class-1a bits per block | Number of Class-1b bits per block |
|---|---|---|---|---|
| CH0-FS | 244 | 244 | 81 | 163 |
| CH1-FS | 204 | 204 | 65 | 139 |
| CH2-FS | 159 | 159 | 75 | 84 |
| CH3-FS | 148 | 148 | 61 | 87 |
| CH4-FS | 134 | 134 | 55 | 79 |
| CH5-FS | 118 | 118 | 55 | 63 |
| CH6-FS | 103 | 103 | 49 | 54 |
| CH7-FS | 95 | 95 | 39 | 56 |

There are no class 2 bits.

The essential parameters for the coder and correspondingly for each decoder are specified as follows for the first coding step:

| Coding mode | Coded voice bits ($K_d$) | CRC-protected bits ($K_{d1a}$) | Number of tail bits ($N_{tail}$) | Number of bits after the first coding step ($K_s = K_d + 6 + N_{tail}$) |
|---|---|---|---|---|
| CH0-FS | 244 | 81 | 5 | 255 |
| CH1-FS | 204 | 65 | 5 | 215 |
| CH2-FS | 159 | 75 | 6 | 171 |
| CH3-FS | 148 | 61 | 6 | 160 |
| CH4-FS | 134 | 55 | 6 | 146 |
| CH5-FS | 118 | 55 | 6 | 130 |
| CH6-FS | 103 | 49 | 6 | 115 |
| CH7-FS | 95 | 39 | 6 | 107 | a) Parity Bits:

A 6-bit CRC (cyclic redundancy check) is used for error detection. These 6 parity bits are generated by using the following cyclic generator polynomial: g(D) =$D^6+D^5+D^3+D^2+D^1+1$ for the first $K_{d1a}$ bits of Class 1, $K_{d1a}$ specifying the number of bits of Class 1a according to the above table. The coding with the cyclic code is performed in systematic manner:

in GF(2), the polynomials:
  $d(0)D(K_{d1a}+5)+d(1)D(K_{d1a}+4)+ \ldots +d(K_{d1a}-1)D^{(6)}+p(0)D^{(5)}+ \ldots +p(4)D+p(5)$
  where p(0), p(1) ... p(5) are the parity bits which, divided by g(D), give "0".

b) Tailing Bits and Reordering

The information bits and parity bits are brought together and so-called tail bits are appended:
u(k)=d (k) for k=0, 1, ... , $K_{d1a}$−1
u(k)=p(k−$K_{d1a}$)for k=$K_{d1a}$, $K_{d1a}$+1, ... , $K_{d1a}$+5
u(k)=d(k−6) for k=$K_{d1a}$+6, $K_{d1a}$+7, ... , $K_d$+5
u(k)=dependent on coding mode Thus, the following contents are defined for each coding mode after the first coding step u(k):

CH0-FS:
 u(k)=d(k) for k=0, 1, . . . , 80
 u(k)=p(k−81) for k=81, 82, . . . , 86
 u(k)=d(k−6) for k=87, 88, . . . , 249
 u(k)=to be specified for k=250, 251, . . . , 254

CH1-FS:
 u(k)=d(k) for k=0, 1, . . . , 64
 u(k)=p(k−65) for k=65, 66, . . . , 70
 u(k)=d(k−6) for k=71, 72, . . . , 209
 u(k)=to be specified for k=210,211, . . . , 214

CH2-FS:
 u(k)=d(k) for k=0, 1, . . . , 74
 u(k)=p(k−75) for k=75, 76, . . . , 80
 u(k)=d(k−6) for k=81, 82, . . . ,164
 u(k)=to be specified for k=165, 166, . . . , 170

CH3-FS:
 u(k)=d(k) for k=0, 1, . . . , 60
 u(k)=p(k−61) for k=61, 62, . . . , 66
 u(k)=d(k−6) for k=67, 68, . . . , 153
 u(k)=to be specified for k=154, 155, . . . , 159

CH4-FS:
 u(k)=d(k) for k=0, 1, . . . , 54
 u(k)=p(k−55) for k=55, 56, . . . , 60
 u(k)=d(k−6) for k=61, 62, . . . , 139
 u(k)=to be specified for k=140, 141, . . . , 145

CH5-FS:
 u(k)=d(k) for k=0, 1, . . . , 54
 u(k)=p(k−55) for k=55, 56, . . . , 60
 u(k)=d(k−6) for k=61, 62, . . . , 123
 u(k)=to be specified for k=124, 125, . . . , 129

CH6-FS:
 u(k)=d(k) for k=0, 1, . . . , 48
 u(k)=p(k−49) for k=49, 50, . . . , 54
 u(k)=d(k−6) for k=55,56, . . . , 108
 u(k)=to be specified for k=109, 110, . . . , 114

CH7-FS:
 u(k)=d(k) for k=0, 1, . . . , 38
 u(k)=p(k−39) for k=39, 40, . . . , 44
 u(k)=d(k−6) for k=45, 46, . . . , 100
 u(k)=to be specified for k=101, 102, . . . , 106

Convolutional Coder

Figure 4:
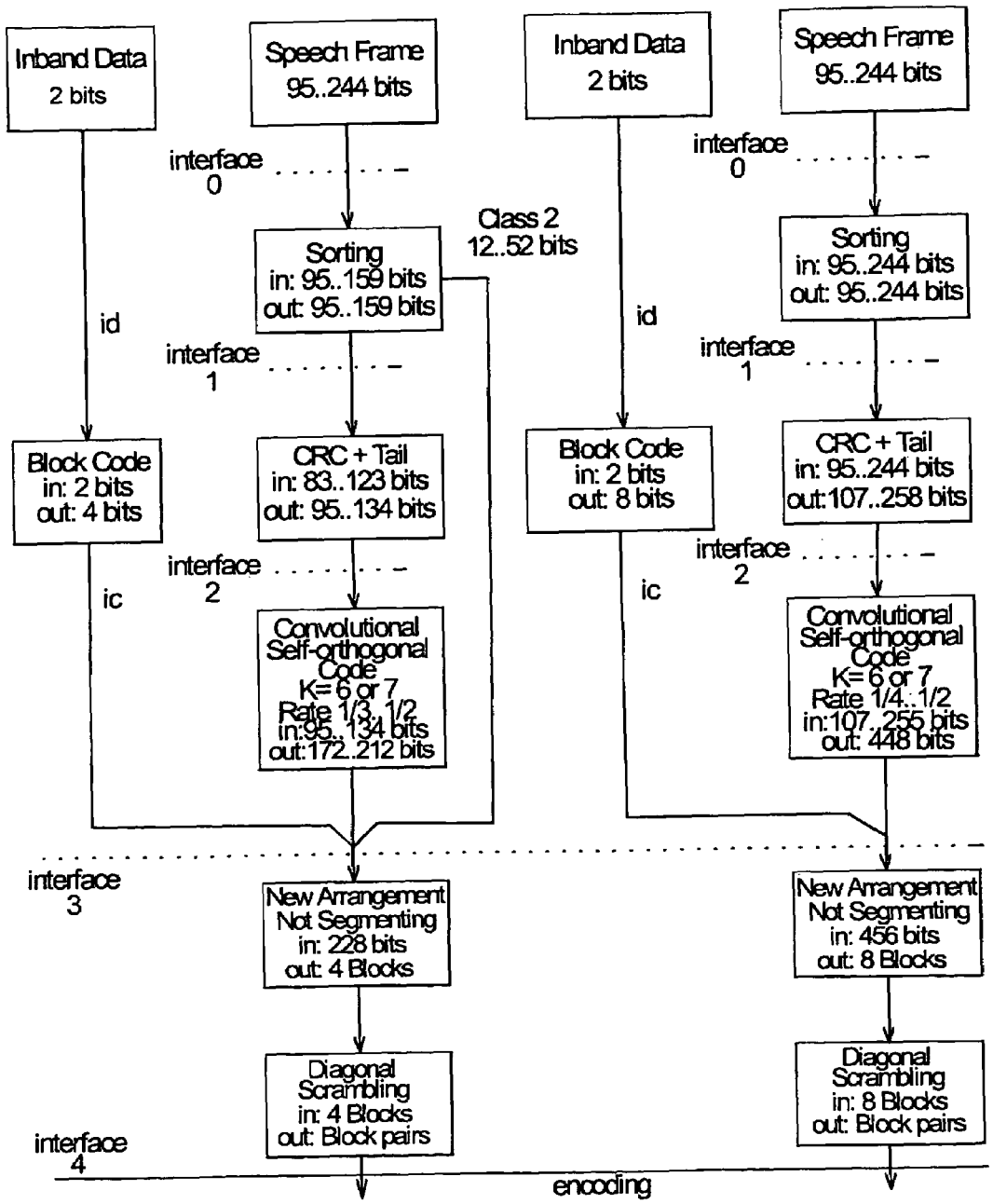
FIG. 4 shows a flow chart of the coding used pursuant to the teachings of the present invention.

The bits of the first coding step (u(k)) are coded with a recursive systematic convolutional code (see also FIG. 4). The number of output bits after puncturing and repetition is 448 bits for all modes of the coding method.

| Coding mode | Generator polynomials of convolutional code | Coder rate | Number of bits received in the coder | Number of bits output by the coder | Number of punctured bits | Number of repeated bits |
|---|---|---|---|---|---|---|
| CH0-FS | G12,G13 | 1/2 | 255 | 510 | 62 | 0 |
| CH1-FS | G12,G13,G14 | 1/3 | 215 | 645 | 197 | 0 |
| CH2-FS | G12,G15,G16 | 1/3 | 171 | 513 | 65 | 0 |
| CH3-FS | G12,G15,G16 | 1/3 | 160 | 480 | 32 | 0 |
| CH4-FS | G12,G15,G16 | 1/4 | 146 | 584 | 136 | 0 |
| CH5-FS | G12,G15,G16,G17 | 1/4 | 130 | 520 | 72 | 0 |
| CH6-FS | G12,G15,G16,G17 | 1/4 | 115 | 460 | 12 | 0 |
| CH7-FS | G12,G15,G16,G17 | 1/4 | 107 | 428 | 19 | 39 |

Further details on coding/decoding using recursive codes were given in C. Berrou, A. Glavieux, "Near optimum error-correction coding and decoding: turbo codes"—"Reflections on the prize paper", IEEE Inf. Theory Soc. Newsletter, vol. 48, No. 2, June 1998 and C. Berrou and A. Glavieux: "Near optimum error-correcting coding and decoding: turbo codes", IEEE Trans. on Comm., vol. 44, pp. 1261–1271, October 1996.

The coding modes are presented in sequence:

CH0-FS:

A block of 255 bits $\{u(0) \ldots u(254)\}$ is coded at the rate ½, using the following polynomials:
 $G12=1$
 $G13=(1+D^2+D^4+D^5)/(1+D+D^2+D^3+D^5)$ The coding with G12=1 refers to the input bit being only multiplied by 1; i.e., it is transmitted uncoded.

From each input bit, one output bit is in each case generated by the coding with G 12 or, respectively, G 13. These appear successively at the output of the coder.

Thus, a serial input sequence of 255 input bits results in a serial sequence of 510 coded bits $\{C(0) \ldots C(509)\}$ at the output of the coder, which is defined by:

$C(2k)=u(k)$
$C(2k+1)=u(k)+u(k-2)+u(k-4)+u(k-5)+C(2k-1)+C(2k-3)+C(2k-5)+C(2k-9)$
for k=0, 1, . . . , 254; u(k)=0 for k<0: C(k)=0 for k<0

The bits at the output are thus coded alternately with G12 and G13.

The code is punctured so that the following 62 coded bits: $\{C(4*j+1)$ for j=79, 80, . . . , 127$\}$ and the bits C(363), C(379), C(395), C(411), C(427), C(443), C(459), C(475), C(491), C(495), C(499), C(503) and C(507) are not transmitted.

As a result, there is a block of 448 coded and punctured bits, P(0) . . . P(447) which is appended to the bits of an in-band signaling in c.

c(k+8)=P(k) for k=0, 1, . . . , 447.

CH1-FS:

A block of 215 bits $\{u(0) \ldots u(214)\}$ is coded at the rate 1/3, using the following polynomials:
 $G12=1$
 $G13=(1+D^2+D^4+D^5)/(1+D+D^2+D^3+D^5)$
 $G14=(1+D^3+D^4+D^5)/(1+D+D^2+D^3+D^5)$ resulting in 645 coded bits, $\{C(0) \ldots C(645)\}$ defined by:
$C(3k)=u(k)$
$C(3k+1)=u(k)+u(k-2)+u(k-4)+u(k-5)+C(3k-2)+C(3k-5)+C(3k-8)+C(3k-14)$
$C(3k+2)=u(k)+u(k-3)+u(k-4)+u(k-5)+C(3k-1)+C(3k-4)+C(3k-7)+C(3k-13)$
for k=0, 1, . . . , 214; u(k)=0 for k<0; C(k)=0 for k<0

The code is punctured so that the following 197 coded bits: $\{C(12*j+5), C(12*j+8), C(12*j+11)$ for j=0, 1, . . . , 25, $\{C(12*j+2), C(12*j+5), C(12*j+8), C(12*j+11)$
 for j=26, 27, . . . , 52$\}$ and the bits C(2), C(610), C(622), C(628), C(634), C(637), C(638), C(640), C(641), C(643) and C(644) are not transmitted.

As a result, there is a block of 448 coded and punctured bits, P(0) . . . P(447) which is appended to the bits of an in-band signaling in c.

c(k+8)=P(k) for k=0, 1, . . . , 447.

CH2-FS:

A block of a=171 bits {u(0) ... u(170)} is coded at the rate 1/3, using the following polynomials:

$G12=1$
$G15=(1+D+D^2+D^3+D^6)/(1+D^2+D^3+D^5+D^6)$
$G16=(1+D+D^4+D^6)/(1+D^2+D^3+D^5+D^6)$ resulting in 513 coded bits, {C(0) ... C(512)} defined by:

$C(3k)=u(k)$
$C(3k+1)=u(k)+u(k-1)+u(k-2)+u(k-3)+u(k-6)+C(3k-5)+C(3k-8)+C(3k-14)+C(3k-17)$
$C(3k+2)=u(k)+u(k-1)+u(k-4)+u(k-6)+C(3k-4)+C(3k-7)+C(3k-11)+C(3k-16)$ for k=0, 1, ..., 170; u(k)=0 for k<0; C(k)=0 for k<0

The code is punctured so that the following 65 coded bits: {C(21*j+20) for j=0, 1, ..., 15 C(21*j+8) C(21*j+11) C(21*j+17) C(21*j+20) for j=16, 17, ..., 23} and the bits C(1), C(2), C(4), C(5), C(8), C(326), C(332), C(488), C(497), C(499), C(502), C(505), C(506), C(508), C(509), C(511) and C(512) are not transmitted.

As a result, there is a block of 448 coded and punctured bits, P(0). P(447) which is appended to the bits of an in-band signaling in c.

$c(k+8)=P(k)$ for k=0, 1, ..., 447.

The polynomials used in modes CH5-FS, CH6-FS, CH7-FS are:

$G17=(1+D^2+D^3+D^4+D^5+D^6)/(1+D^2+D^3+D^5+D^6)$

The significant values for modes (CH3-FS, CH4-FS, CH5-FS, CH6-FS, CH7-FS) are:

CH3-FS:

$C(3k)=u(k)$
$C(3k+1)=u(k)+u(k-1)+u(k-2)+u(k-3)+u(k-6)+C(3k-5)+C(3k-8)+C(3k-14)+C(3k-17)$
$C(3k+2)=u(k)+u(k-1)+u(k-4)+u(k-6)+C(3k-4)+C(3k-7)+C(3k-11)+C(3k-16)$ for k=0, 1, ..., 159; u(k)=0 for k<0; C(k)=0 for k<0

Bits {C(18*j+2), C(21*j+8), C(21*j+11), C(21*j+17) for j=20, 21, ... 25} and C(353), C(359), C(470), C(473), C(475), C(476), C(478), C(479) are not transmitted.

CH4-FS:

$C(4k)=u(k)$
$C(4k+1)=u(k)+u(k-1)+u(k-2)+u(k-3)+u(k-6)+C(4k-7)+C(4k-11)+C(4k-19)+C(4k-23)$
$C(4k+2)=u(k)+u(k-1)+u(k-4)+u(k-6)+C(4k-6)+C(4k-10)+C(4k-18)+C(4k-22)$
$C(4k+3)=U(k)+u(k-2)+u(k-3)+u(k-4)+u(k-5)+u(k-6)+C(4k-5)+C(4k-9)+C(4k-17)+C(4k-21)$ for k=0, 1, ..., 145; u(k)=0 for k<0; C(k)=0 for k<0

Bits {C(32*j+7), C(32*j+15), C(32*j+23), C(32*j+27) C(32*j+31) for j=1, 0, ..., 10 C(16*j+3) C(16*j+7) C(16*j+11) C(16*j+14)C(16*j+15) for j=22, 23, ..., 35} and bits C(2), C(3), C(11), C(331), C(566), C(570), C(578), C(579), C(581), C(582) and C(583) are not transmitted.

CH5-FS:

$C(4k)=u(k)$
$C(4k+1)=u(k)+u(k-1)+u(k-2)+u(k-3)+u(k-6)+C(4k-7)+C(4k-11)+C(4k-19)+C(4k-23)$
$C(4k+2)=u(k)+u(k-1)+u(k-4)+u(k-6)+C(4k-6)+C(4k-10)+C(4k-18)+C(4k-22)$
$C(4k+3)=u(k)+u(k-2)+u(k-3)+u(k-4)+u(k-5)+u(k-6)+C(4k-5)+C(4k-9)+C(4k-17)+C(4k-21)$ for k=0, 1, ..., 129; u(k)=0 for k<0; C(k)=0 for k<0

Bits

{C(32*j+11), C(32*j+23), C(32*j+31) for j=0, 1, ..., 9 C(32*j+7), C(32*j+11), C(32*j+15), C(32*j+23), C(32*j+27), C(32*j+31) for j= 10, 11, ..., 15} and bits C(499), C(510), C(514), C(515), C(518), C(519) are not transmitted.

CH6-FS:

$C(4k)=u(k)$
$C(4k+1)=u(k)+u(k-1)+u(k-2)+u(k-3)+u(k-6)+C(4k-7)+C(4k-11)+C(4k-19)+C(4k-23)$
$C(4k+2)=u(k)+u(k-1)+u(k-4)+u(k-6)+C(4k-6)+C(4k-10)+C(4k-18)+C(4k-22)$
$C(4k+3)=u(k)+u(k-2)+u(k-3)+u(k-4)+u(k-5)+u(k-6)+C(4k-5)+C(4k-9)+C(4k-17)+C(4k-21)$ for k=0, 1, ..., 114; u(k)=0 for k<0; C(k)=0 for k<0

Bits

{C(16*j+11) for j=22, 23, ..., 28} and bits C(450), C(451), C(454), C(455), C(458) are not transmitted.

CH7-FS:

$C(4k)=u(k)$
$C(4k+1)=u(k)+u(k-1)+u(k-2)+u(k-3)+u(k-6)+C(4k-7)+C(4k-11)+C(4k-19)+C(4k-23)$
$C(4k+2)=u(k)+u(k-1)+u(k-4)+u(k-6)+C(4k-6)+C(4k-10)+C(4k-18)+C(4k-22)$
$C(4k+3)=u(k)+u(k-2)+u(k-3)+u(k-4)+u(k-5)+u(k-6)+C(4k-5)+C(4k-9)+C(4k-17)+C(4k-21)$ for k=0, 1, ..., 94; u(k)=0 for k<0; C(k)=0 for k<0

Bits

C(1), C(2), C(3), C(6), C(7), C(11), C(367), C(383), C(399), C(407), C(415), C(418), C(419), C(421), C(422), C(423), C(425), C(426), C(427) are removed. In this block of 409 coded and punctured bits, P(0) ... P(408), 39 bits are repeated:

$P(409+k)=P(10+k*8)$ for k=0, 1, ..., 38

Coding in Half-Rate Mode (HR)

Coding of the Bits of the In-Band Signaling:

| id(0,1) | ic(0 ... 3) |
| --- | --- |
| 00 | 0000 |
| 01 | 1001 |
| 10 | 0111 |
| 11 | 1110 |

Distribution of the Bits to Classes:

| Coding mode | Number of voice bits per block | Number of Class-1 bits per block | Number of Class-1a bits per block | Number of Class-1b bits per block | Number of Class-2 bits per block |
| --- | --- | --- | --- | --- | --- |
| CH8-HS | 159 | 123 | 67 | 56 | 36 |
| CH9-HS | 148 | 120 | 61 | 59 | 28 |
| CH10-HS | 134 | 110 | 55 | 55 | 24 |
| CH11-HS | 118 | 102 | 55 | 47 | 16 |
| CH12-HS | 103 | 91 | 49 | 42 | 12 |
| CH13-HS | 95 | 83 | 39 | 44 | 12 |

The essential parameters for the coder and correspondingly for each decoder are specified as follows for the first coding step:

| Coding mode | Number of Class 1 bits ($K_{d1}$) | CRC-protected bits ($K_{dts}$) | Number of tail bits ($N_{tail}$) | Number of output bits after the first coding step ($K_u = K_{d1} + 6 + N_{tail}$) |
|---|---|---|---|---|
| CH8-HS | 123 | 67 | 5 | 134 |
| CH9-HS | 120 | 61 | 5 | 131 |
| CH10-HS | 110 | 55 | 5 | 121 |
| CH11-HS | 102 | 55 | 5 | 113 |
| CH12-HS | 91 | 49 | 6 | 103 |
| CH13-HS | 83 | 39 | 6 | 95 |

The information on the parity and tail bits and on the reordering corresponding to the full-rate mode.

After the first coding step u(k), the following contents are defined for each coding mode:

CH8-HS:
  u(k)=d(k) for k=0, 1, . . . , 66
  u(k)=p(k−67) for k=67, 68, . . . , 72
  u(k)=d(k−6) for k=73, 74, . . . , 128
  u(k)=to be specified for k=129, 130, . . . , 133

CH9-HS:
  u(k)=d(k) for k=0, 1, . . . , 60
  u(k)=p(k−61) for k=61, 62, . . . , 66
  u(k)=d(k−6) for k=67, 68, . . . , 125
  u(k)=to be specified for k=126, 127, . . . , 130

CH10-HS:
  u(k)=d(k) for k=0, 1, . . . , 54
  u(k)=p(k−55) for k=55, 56, . . . , 60
  u(k)=d(k−6) for k=61, 62, . . . , 115
  u(k) to be specified for k=116, 117, . . . , 120

CH11-HS:
  u(k)=d(k) for k=0, 1, . . . , 54
  u(k)=p(k−55) for k=55, 56, . . . , 60
  u(k)=d(k−6) for k=61, 62, . . . , 107
  (k)=to be specified for k=108, 109, . . . , 112

CH12-HS:
  u(k)=d(k) for k=0, 1, . . . , 48
  u(k)=p(k−49) for k=49, 50, . . . , 54
  u(k)=d(k−6) for k=55, 56, . . . , 96
  u(k)=to be specified for k=97, 98, . . . , 102

CH13-HS:
  u(k)=d(k) for k=0, 1, . . . , 38
  u(k)=p(k−39) for k=39, 40, . . . , 44
  u(k)=d(k−6) for k=45, 46, . . . , 88
  u(k)=to be specified for k=89, 90, . . . , 94

Convolutional Coder

The bits of the first coding step (u(k)) are coded with a recursive systematic convolutional code (see also FIG. 4). The number of output bits after puncturing and repetition is 448 bits for all modes of the coding method.

| Coding mode | Generator polynomials of convolutional code | Number of bits received in the coder | Coder rate | Number of bits output by the coder | Number of punctured bits |
|---|---|---|---|---|---|
| CH8-HS | G12,G13 | 134 | 1/2 | 268 | 80 |
| CH9-HS | G12,G13 | 131 | 1/2 | 262 | 66 |
| CH10-HS | G12,G13 | 121 | 1/2 | 242 | 42 |
| CH11-HS | G12,G13 | 113 | 1/2 | 226 | 18 |
| CH12-HS | G12,G15,G16 | 103 | 1/3 | 309 | 97 |
| CH13-HS | G12,G15,G16 | 95 | 1/3 | 285 | 73 |

The coding modes are presented in sequence:

CH8-HS:

One block of 134 bits {u(0) . . . u(133)} each is coded at the rate of ½, using the following polynomials:
  G12=1
  G13=$(1+D^2+D^4+D^5)/(1+D+D^2+D^3+D^5)$ resulting in 268 coded bits, {C(0) . . . C(267)}, defined by:
  C(2k)=u(k)
  C(2k+1) u(k)+u(k−2)+u(k−4)+u(k−5)+C(2k 1)+C(2k−3)+C(2k−5)+C(2k−9)
  for k=0, 1, . . . , 133; u(k)=0 for k<0; C(k)=0 for k<0

The code is punctured so that the following 80 coded bits:
{C(8*j+3), C(8*j+7) for j=0, 1, . . . , 21
C(8*j+3), C(8*j+5), C(8*j+7) for j=22, 23, . . . , 32)} and the bits C(1), C(265) and C(267) are not transmitted.

As a result, there is a block of 188 coded and punctured bits, P(0). P(187) which is appended to the bits of an in-band signaling in c.
  c(k+4)=P(k) for k=0, 1, . . . , 187.
Finally, 36 Class-2 bits are appended to c
  c(192+k)=d(123+k) for k=0, 1, . . . , 35.

CH9-HS:

The 262 coded bits {C(0) . . . C(261)}
  C(2k)=u(k)
  C(2k+1)=u(k)+u(k−2)+u(k−4)+u(k−5)+C(2k−1)+C(2k−3)+C(2k−5)+C(2k−9)
  for k=0, 1, . . . , 130; u(k)=0 for k<0; C(k)=0 for k<0
are punctured so that 66 coded bits:
{C(16*j+3), C(16*j+7), C(16*j+11) for j=0, 1, . . . , 7
C(16*j+3), C(16*j+7), C(16*j+11), C(16*j+15) for j=8, 9, . . . , 15)} and the bits C(1), C(221), C(229), C(237), C(245), C(249), C(253), C(257), C(259) and C(261) are not transmitted.

A block of 196 coded and punctured bits, P(0). P(195) is appended to the bits of the in-band signaling in c:
  c(k+4)=P(k) for k=0, 1, . . . , 195.
Finally, 28 Class-2 bits are appended to c:
  c(200+k)=d(120+k) for k=0, 1, . . . , 27.

CH10-HS:

The 242 coded bits {C(0) . . . C(241)}:
  C(2k)=u(k)
  C(2k+1)=u(k)+u(k−2)+u(k−4)+u(k−5)+C(2k−1)+C(2k−3)+C(2k−5)+C(2k−9)
  for k=0, 1, . . . , 106; u(k)=0 for k<0; C(k)=0 for k<0
are punctured so that 42 coded bits:
{C(8*j+3) for j=0, 1, . . . , 21
C(8*j+3), C(8*j+7) for j=22, 23, . . . , 29)} and the bits C(1), C(233), C(237) and C(241) are not transmitted.

A block of 200 coded and punctured bits, P(0). P(199) is appended to the bits of the in-band signaling in c:
c(k+4)=P(k) for k=0, 1, . . . , 199.
Finally, 24 Class-2 bits are appended to c:
c(204+k)=d(110+k) for k=0, 1, . . . , 23.

CH11-HS:

The 226 coded bits {C(0) . . . C(225)}:
C(2k)=u(k)
C(2k+1)=u(k)+u(k−2)+u(k−4)+u(k−5)+C(2k−1)+C(2k−3) +C(2k−5)+C(2k−9)
for k=0, 1, . . . , 112; u(k)=0 for k<0; C(k)=0 for k<0 are punctured so that 18 coded bits:
{C(28*j+15) for j=0, 1, . . . , 7} and bits C(1), C(3), C(7), C(197), C(213), C(215), C(217), C(221), C(223) and C(225) are not transmitted.

A block of 208 coded and punctured bits, P(0). P(207) is appended to the bits of the in-band signaling in c:
c(k+4)=P(k) for k=0, 1, . . . , 207.
Finally, 16 Class-2 bits are appended to c:
c(212+k)=d(96+k) for k=0, 1, . . . , 15.

CH12-HS:

The 309 coded bits {C(0) . . . C(308)}: C(3k)=u(k)
C(3k+1)=u(k)+u(k−1)+u(k−2)+u(k−3)+u(k−6)+C(3k−5)+C (3k−8)+C(3k−14)+C(3k−17)
C(3k+2)=u(k)+u(k−1)+u(k−4)+u(k−6)+C(3k−4)+C(3k−7) +C(3k−11)+C(3k−16)
for k=0, 1, . . . , 102; u(k)=0 for k<0; C(k)=0 for k<0 are punctured so that 97 coded bits:
{C(12*j+5), C(12*j+8), C(12*j+11) for j=0, 1, . . . , 15
C(12*j+2), C(12*j+5), C(12*j+8), C(12*j+11) for j=16, 17, . . . , 24) and bits C(1), C(2), C(4), C(7), C(292), C(292), C(295), C(298), C(301), C(302), C(304), C(305), C(307) and C(308) are not transmitted.

A block of 212 coded and punctured bits, P(0) . . . P(211) is appended to the bits of the in-band signaling in c:
c(k+4)=P(k) for k=0, 1, . . . , 211.
Finally, 12 Class-2 bits are appended to c:
c(216+k)=d(91+k) for k=0, 1, . . . , 11.

CH13-HS:

The 285 coded bits {C(0) . . . C(284)}:
C(3k)=u(k)
C(3k+1)=u(k)+u(k−1)+u(k−2)+u(k−3)+u(k−6)+C(3k−5)+C (3k−8)+C(3k−14)+C(3k−17)
C(3k+2)=u(k)+u(k−1)+u(k−4)+u(k−6)+C(3k−4)+C(3k−7) +C(3k−11)+C(3k−16)
for k=0, 1, . . . , 94; u(k)=0 for k<0; C(k)=0 for k<0 are punctured so that 73 coded bits:
{C(12*j+5), C(12*j+11) for j=0, 1, . . . , 11
C(12*j+5), C(12*j+8), C(12*j+11) for j=12, 13, . . . , 22} and bits C(1), C(2), C(4), C(7), C(8), C(14), C(242), C(254), C(266), C(274), C(277), C(278), C(280), C(281), C(283) and C(284) are not transmitted.

A block of 212 coded and punctured bits, P(0) . . . P(211) is appended to the bits of the in-band signaling in c:
c(k+4)=P(k) for k=0, 1, . . . , 211.
Finally, 12 Class-2 bits are appended to c:
c(216+k)=d(91+k) for k=0, 1, . . . , 11.

The polynomials of the systematic recursive code (G13 to G17) in the AMR (see FIG. 5) shown were used for two reasons:

they have optimum characteristics for the puncturing; i.e., the adaptation of the data rate to the transmission rate of the radio channel, and numerator or denominator polynomial are in each case also the polynomial used in the original AMR channel coding proposal (see Tdoc SMG 147/98).

The necessary changes are thus minimum compared with the original proposal.

The polynomials used hitherto for voice, data and signaling information in the GSM system can also be used for the AMR channel coder with negligible restrictions in the performance. This can be done instead of the polynomials described above or as a complete alternative channel coding arrangement. The advantage lies in that the compatibility is extended further since in some cases older pre-existing hardware components in the channel decoder only allow the previous GSM polynomials to be used.

Figure 6:
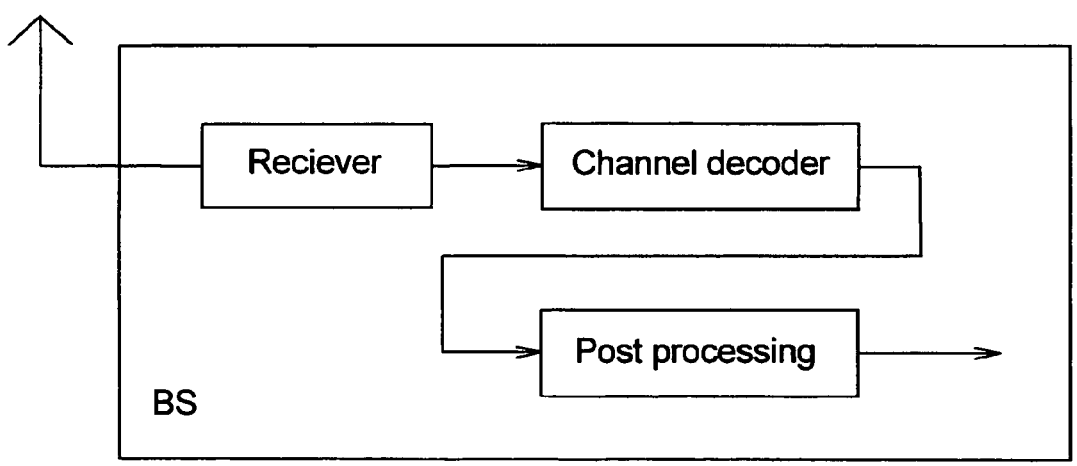
FIG. 6 shows a flow chart of the decoding.

FIG. 6 shows a base station BS in which, in the reception case, signals received via an antenna A are amplified in a receiver, filtered, converted to baseband and digitized. This is followed by channel decoding (step 1), which can be done with decoding devices installed in existing base stations BS; i.e., the circuit technology can remain unchanged. This is followed by post-processing (step 2) of the decoded data which is implemented as a program. This post-processing consists of convolutional coding at a rate of 1 with the denominator polynomial of the respective rate.

As a result, this post-processing is of little complexity and is performed, for example, by an additional program in a DSP (digital signal processor).

Referring, e.g. to the rate CH0-FS, this refers to the block with 255 bits at the output of the decoder being coded with the polynomial:

$G(D)=(1+D+D^2+D^3+D^5)$ in order to obtain the 255 original bits. The number of data bits remains constant; i.e., a current data bit at the input of this post-processing yields exactly one original bit with the aid of past input bits.

The coding and decoding methods described can be used both in base stations BS and in mobile stations MS.

Although the present invention has been described with reference to specific embodiments, those of skill in the art will recognize that changes may be made thereto without departing from the spirit and scope of the invention as set forth in the hereafter appended claims.

What is claimed is:

1. A method for channel coding in a GSM mobile radio system, wherein the channel coding uses recursive systematic codes and is performed at a transmitting end for transmission via a radio interface between a base station and a subscriber station, the method comprising the steps of:

arranging voice information to be coded based on at least one of a sensitivity of the voice information to transmission errors and a priority associated with the voice information;

subdividing the voice information into at least first and second voice information;

performing a channel coding for the first voice information which, in a first coding step, uses error protection codes for a cyclic redundancy check and, in a second coding step, uses recursive systematic codes comprising a numerator polynomial and a denominator polynomial;

performing a channel coding for the second voice information which uses recursive systematic codes comprising a numerator polynomial and a denominator polynomial;

performing a channel decoding comprising successive nonrecursive individual steps at a receiving end; and performing post-processing based on the denominator polynomial after channel decoding with the numerator polynomial.

2. A method for channel coding in a GSM mobile radio system as claimed in claim 1, the method further comprising the steps of:
generating the error protection codes for the cyclic redundancy check using a generator polynomial
$g(D)=D^6+D^5+D^3+D^2D^1+1$.

3. A method for channel coding in a GSM mobile radio system as claimed in claim 1, the method further comprising the step of:
generating the recursive systematic codes using a generating polynomial
$g(D)=1+D+D^3+D^4/1+D^3+D^4$ or
$g(D)=1+D+D^4+D^6/1+D^2+D^3+D^5+D^6$.

4. A method for channel coding in a GSM mobile radio system as claimed in claim 1, wherein the post-processing is performed by a programmer.

5. A method for channel coding in a GSM mobile radio system as claimed in claim 1, the method further comprising the step of:
obtaining a priori knowledge from previous decoding at a receiving end and using the a priori knowledge in subsequent channel decoding.

6. A method for channel coding in a GSM mobile radio system as claimed in claim 1, the method further comprising the step of:
switching off completely the channel decoding in a subscriber station and using, thereafter, transmitted systematic data bits which are not channel coded.

7. A method for channel coding in a GSM mobile radio system as claimed in claim 1, the method further comprising the steps of:
determining a transmission quality during a channel estimation; and
switching the channel decoding, depending on the transmission quality, at least one of on and off.

8. A method for channel coding in a GSM mobile radio system as claimed in claim 1, the method further comprising the step of:
using the recursive systematic codes in an adaptive mutirate coder wherein the coder is selected in accordance with transmission conditions.

9. A method for channel coding in a GSM mobile radio system as claimed in claim 1, the method further comprising the step of:
using at least one polynomial of a nonrecursive systematic code previously used in the GSM mobile radio system as one of the numerator and denominator polynomials of the recursive systematic codes.

* * * * *